United States Patent [19]

Asazawa

[11] Patent Number: 5,594,633
[45] Date of Patent: Jan. 14, 1997

[54] VOLTAGE-TO-CURRENT CONVERTING CIRCUIT OPERATING WITH LOW SUPPLY VOLTAGE

[75] Inventor: Hiroshi Asazawa, Tokyo, Japan

[73] Assignee: NEC Corporation, Japan

[21] Appl. No.: 514,930

[22] Filed: Aug. 14, 1995

[30] Foreign Application Priority Data

Aug. 12, 1994 [JP] Japan ................................ 6-190270

[51] Int. Cl.$^6$ ........................................... H02M 7/00
[52] U.S. Cl. ................................ 363/73; 323/315
[58] Field of Search ........................... 323/312, 315; 363/73; 327/538, 542

[56] References Cited

U.S. PATENT DOCUMENTS

| | | | |
|---|---|---|---|
| 4,442,400 | 4/1984 | Nagano | 323/315 |
| 4,647,841 | 3/1987 | Miller | 323/316 |
| 4,675,594 | 6/1987 | Reinke | 323/317 |
| 4,896,333 | 1/1990 | Can | 375/7 |
| 5,252,910 | 10/1993 | Agaesse | 323/315 |
| 5,341,087 | 8/1994 | Van Leeuwen | 323/315 |
| 5,367,248 | 11/1994 | Lin | 323/312 |
| 5,451,859 | 9/1995 | Ryat | 323/312 |
| 5,498,953 | 3/1996 | Ryat | 323/315 |
| 5,515,260 | 5/1996 | Watanabe et al. | 363/73 |

FOREIGN PATENT DOCUMENTS

| | | |
|---|---|---|
| 0091307 | 10/1983 | European Pat. Off. . |
| 3027761 | 7/1980 | Germany .......... 323/315 |
| 0059321 | 5/1981 | Japan ................ 323/315 |
| 333989 | 2/1991 | Japan . |

OTHER PUBLICATIONS

Digest of Technical Papers—"Direct–Conversion Quadrature Modulator" Tsukhara et al. pp. 40–41 (Japan 1994).

Primary Examiner—Peter S. Wong
Assistant Examiner—Adolf Berhane
Attorney, Agent, or Firm—Ostrolenk, Faber, Gerb & Soffen, LLP

[57] ABSTRACT

A voltage-to-current converting circuit configured to convert an input voltage signal into a pair of complementary current signals by use of a current mirror, comprises a transistor 4 connected in the form of a diode and connected in series with a constant current source 21, a transistor 3 having a collector connector to a collector of the transistor 4, a transistor 2 having a base connected to a base of the transistor 3 so as to form a current mirror in cooperation with the transistor 3, the base of the transistor 2 being connected to receive an input voltage signal Vin, a bias circuit 5 for biasing the base of the transistors 3 and 2, and a transistor 1 having a base connected to a base of the transistor 4 so as to form a current mirror in cooperation with the transistor 4. The input voltage Vin is converted into a collector current I1 of the transistor 1 and a collector current I2 of the transistor 2. Thus, the voltage-to-current converting circuit is composed of only NPN transistors, so that a manufacturing process is simplified. In addition, since no emitter follower is included, a low voltage operation can be realized. This circuit can be applied to a multiplier, frequency doubler, a frequency mixer, etc.

7 Claims, 9 Drawing Sheets

VOLTAGE-TO-CURRENT CONVERTING CIRCUIT OPERATING WITH LOW SUPPLY VOLTAGE

BACKGROUND OF THE INVENTION

1. Field of the Invention

The present invention relates to a voltage-to-current converting circuit, and more specifically to a voltage-to-current converting circuit which can be used to constitute a current driving circuit in an analog multiplying circuit operating with a low voltage and which has a balance/unbalance conversion function.

2. Description of Related Art

Figure 1:
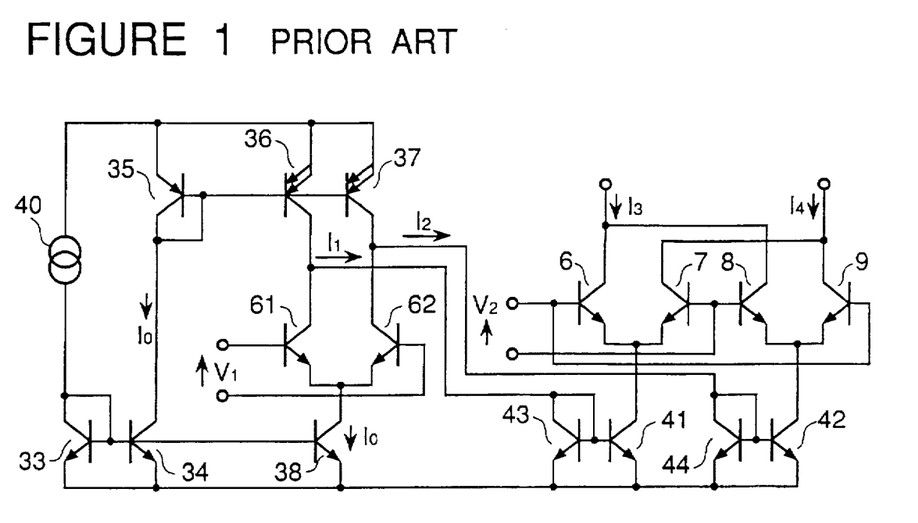
FIG. 1 is a circuit diagram of an example of an analog multiplying circuit including a conventional voltage-to-current converting circuit.

Referring to FIG. 1, there is shown an analog multiplying circuit having a conventional voltage-to-current converting circuit, which is disclosed in Japanese Patent Application Laid-open Publication No. JP-A-3-033989, the disclosure of which is incorporated by reference in its entirety into the present application.

In the shown multiplying circuit, the voltage-to-current converting circuit includes a constant current circuit driven by a constant current source 40 and including a current mirror circuit composed of transistors 33, 34 and 38, and a differential amplifier circuit including a pair of transistors 61 and 62 so as to convert an input voltage signal V1 to collector currents of the transistors 61 and 62, so that difference between the respective collector currents of the transistors 61 and 62 and respective collector currents of constant current source transistors 36 and 37 formed of PNP transistors, are outputted as a pair of complementary output currents I1 and I2, respectively.

The output currents I1 and I2 of the voltage-to-current converting circuit are supplied to a Gilbert cell. This Gilbert cell includes two current mirror circuits, one of which is composed of transistors 43 and 41, and the other of which is composed of transistors 44 and 42, so that the currents I1 and I2 applied to one transistors 43 and 44 of the current mirror circuits are converted into a collector current of the other transistors 41 and 42 of the current mirror circuits, respectively. The Gilbert cell also includes a first differential pair driven by the transistor 41 and composed of a pair of transistor 6 and 7 receiving a second input voltage signal V2 as a differential input, and a second differential pair driven by the transistor 42 and composed of a pair of transistor 8 and 9 also receiving the second input voltage signal V2 as a differential input, In the above mentioned analog multiplying circuit, (1) since the voltage-to-current converting circuit does not use an emitter follower, and (2) since the transistors 41 and 42 are operated as a current sources complimentary to each other with requiring no constant current source in the Gilbert cell, an low voltage operation can be realized, and the result of the multiplication of the inputs V1 and V2 can be obtained in the form of currents I3 and I4.

Figure 2:
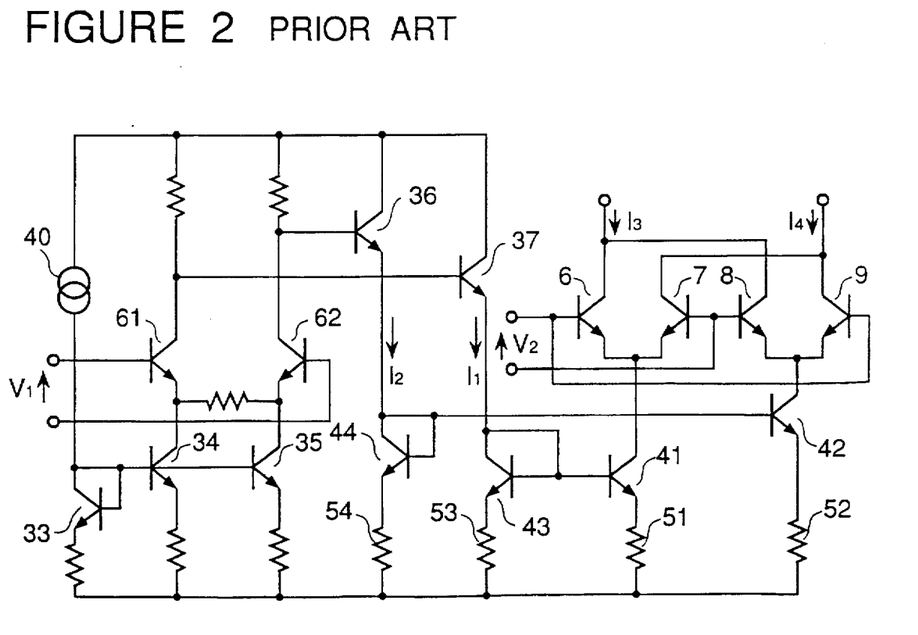
FIG. 2 is a circuit diagram of an example of an analog multiplying circuit including another conventional voltage-to-current converting circuit.

Another conventional voltage-to-current converting circuit is shown in T. Tsukahara et al, "WP2.6: A 2 V 2 GHz Si-Bipolar Direct-Conversion Quadrature Modulator", ISSCC94, Feb. 16, 1994, Digest of Technical Papers, pp 40–41, the disclosure of which is incorporated by reference in its entirety into the present application. This circuit is shown in FIG. 2, in which elements similar to those shown in FIG. 1 are given the same Reference Numerals. The shown circuit is configured so that an output voltage of a differential amplifying circuit having a differential pair composed of transistors 61 and 62 is voltage-to-current converted into output currents I1 and I2 by action of emitter followers composed of transistors 36 and 37, transistors 43 and 44 connected in the form of a diode and emitter resistors 53 and 54. The shown circuit also includes a current mirror circuit composed of transistor 41 and a resistor 51, another mirror circuit composed of transistor 42 and a resistor 52, and a Gilbert cell constituted of transistors 6, 7, 8 and 9. With this arrangement, the result of the multiplication of the inputs V1 and V2 can be obtained in the form of currents I3 and I4.

In the conventional conventional voltage-to-current converting circuit shown in FIG. 1, the PNP transistors 36 and 37 are used as a load of the differential amplifying circuit for obtaining a current difference, and also in a folded path (namely, reflected current path) of the current mirror circuit. In order to realize the voltage-to-current converting circuit shown in FIG. 1, it is necessary to use a device manufacturing processor for formation of PNP transistors. Ordinarily, the device manufacturing process for an LSI including PNP transistors is more difficult than that for an LSI including only NPN transistors. Accordingly, if the voltage-to-current converting circuit shown in FIG. 1 is adopted, the cost of the LSI becomes high.

In the conventional voltage-to-current converting circuit shown in FIG. 2, since the emitter followers composed of the transistors 36 and 37 are included, it is disadvantageous in that there is required a supply voltage higher than that of a circuit having no emitter followers, by about 0.8 V of an emitter-base forward direction voltage drop. The above referred paper mentions that an operating voltage of the circuit is 2 V.

SUMMARY OF THE INVENTION

Accordingly, it is an object of the present invention to provide a voltage-to-current converting circuit which has overcome the above mentioned defects of the conventional ones.

Another object of the present invention is to provide a voltage-to-current converting circuit, which is constituted with no emitter follower so that the circuit can operate at a low supply voltage, and which is composed of only NPN transistors so that the circuit can be manufactured without making the manufacturing process complicated.

The above and other objects of the present invention are achieved in accordance with the present invention by a voltage-to-current converting circuit comprising:

- a constant current source having one end connected to a voltage supply;
- a first transistor having a base connected to a first input terminal and an emitter connected to ground, so that a first output current is obtained from a collector of the first transistor;
- a second transistor having a base connected to the first input terminal and an emitter connected to ground, a collector of the second transistor being connected to the other end of the constant current source;
- a third transistor having an emitter connected to ground, and a base and a collector connected in common to the other end of the constant current source;
- a fourth transistor having a base connected to the base and the collector of the third transistor, and an emitter connected to ground, so that an output current is obtained from a collector of the fourth transistor;
- whereby a voltage applied to the first input terminal is converted into the output currents of the fourth and first transistors.

In the above mentioned voltage-to-current converting circuit, a voltage Vin applied to the first input terminal, is converted into a first output current I1 flowing through the collector of the fourth transistor and a second output current I2 flowing through the collector of the first transistor. In this voltage-to-current conversion, if the constant current source is constituted of a resistor, the whole of the voltage-to-current converting circuit can be formed as an integrated circuit composed of only NPN transistors. Since the integrated circuit can be formed by use of the manufacturing process for the NPN transistors, and in addition, since no emitter follower is adopted, the voltage-to-current converting circuit can be caused to operate with a low supply voltage.

Therefore, in a preferred embodiment of the voltage-to-current converting circuit, the emitter of each of the first to fourth transistors is connected through a resistor to the ground. In this construction, linearity of the input-to-output characteristics can be improved.

In addition, the constant current source is preferably constituted of a resistor connected at its one end to the voltage supply and at its other end to the collector of the second and third transistors. In this construction, the circuit construction is further simplified.

In a more preferred embodiment, the voltage-to-current converting circuit further includes a fifth transistor having a base and a collector connected in common to the first input terminal and an emitter connected to the ground, a second constant current source connected between the first input terminal and the voltage supply, and a capacitor having one end connected to the first input terminal, an input signal being applied to the other end of the capacitor from an external.

In this embodiment, the second constant current source is preferably constituted of a resistor connected at its one end to the voltage supply and at its other end to the first input terminal. In this construction, the circuit construction is further simplified.

Furthermore, according to another aspect of the present invention, the above mentioned voltage-to-current converting circuit further includes:

sixth and seventh transistors having their emitter connected in common to the collector of the fourth transistor and eighth and ninth transistors having their emitter connected in common to the collector of the first transistor, a base of each of the sixth and ninth transistors being connected to a second input terminal, and a base of each of the seventh and eighth transistors being connected to a third input terminal, a first input signal being applied to the first input terminal, and a second input signal being applied between the second and third input terminals in the form of a differential signal, a collector of the sixth transistor and a collector of the eighth transistor being connected to each other so that a third output current is obtained, and a collector of the seventh transistor and a collector of the ninth transistor being connected to each other so that a fourth output current is obtained.

With this arrangement, an analog multiplying circuit can be constituted using the voltage-to-current converting circuit in accordance with the first aspect of the present invention.

The above and other objects, features and advantages of the present invention will be apparent from the following description of preferred embodiments of the invention with reference to the accompanying drawings.

DESCRIPTION OF THE PREFERRED EMBODIMENTS

Figure 3:
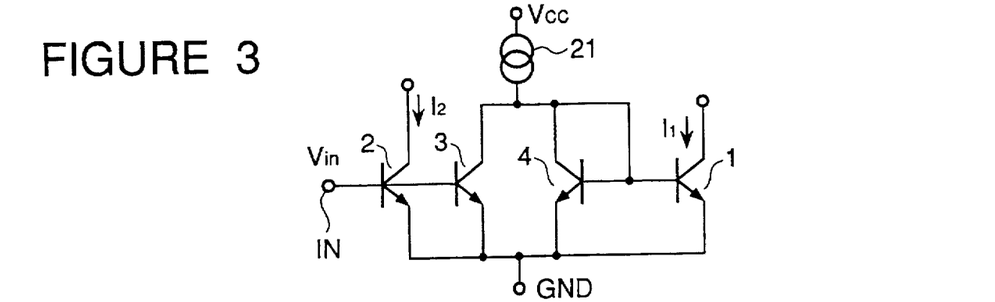
FIG. 3 is a circuit diagram of a first embodiment of the voltage-to-current converting circuit in accordance with the present invention.

Referring to FIG. 3, there is shown a circuit diagram of a first embodiment of the voltage-to-current converting circuit in accordance with the present invention.

The shown voltage-to-current converting circuit includes a constant current source 21 having one end connected to a supply voltage $V_{CC}$, an emitter-grounded NPN transistor 2 having a base connected to an input terminal IN and a collector from which an output current I2 is obtained, another emitter-grounded NPN transistor 3 having a base connected to the first input terminal IN and a collector connected to the other end of the constant current source 21, still another emitter-grounded NPN transistor 4 having a base and a collector connected in common to the other end of the constant current source 21, and a further emitter-grounded NPN transistor 1 having a base connected to the base and the collector of the transistor 4, and a collector from which an output current I1 is obtained.

With this arrangement, a voltage Vin is applied to the input terminal IN, and the output currents I1 and I2 can be obtained from the transistors 1 and 2.

The constant current source 21 can be formed of a PNP transistor, but can be formed of a resistor in the simplest form. Assuming that a current flowing the constant current source 21 is I0, since the flowing through each of the transistors 2 and 3 is I2, the current I1 flowing through each of the transistors 4 and 1 can be expressed as follows:

$$I1 = I0 - I2 \qquad (1)$$

Figure 10:
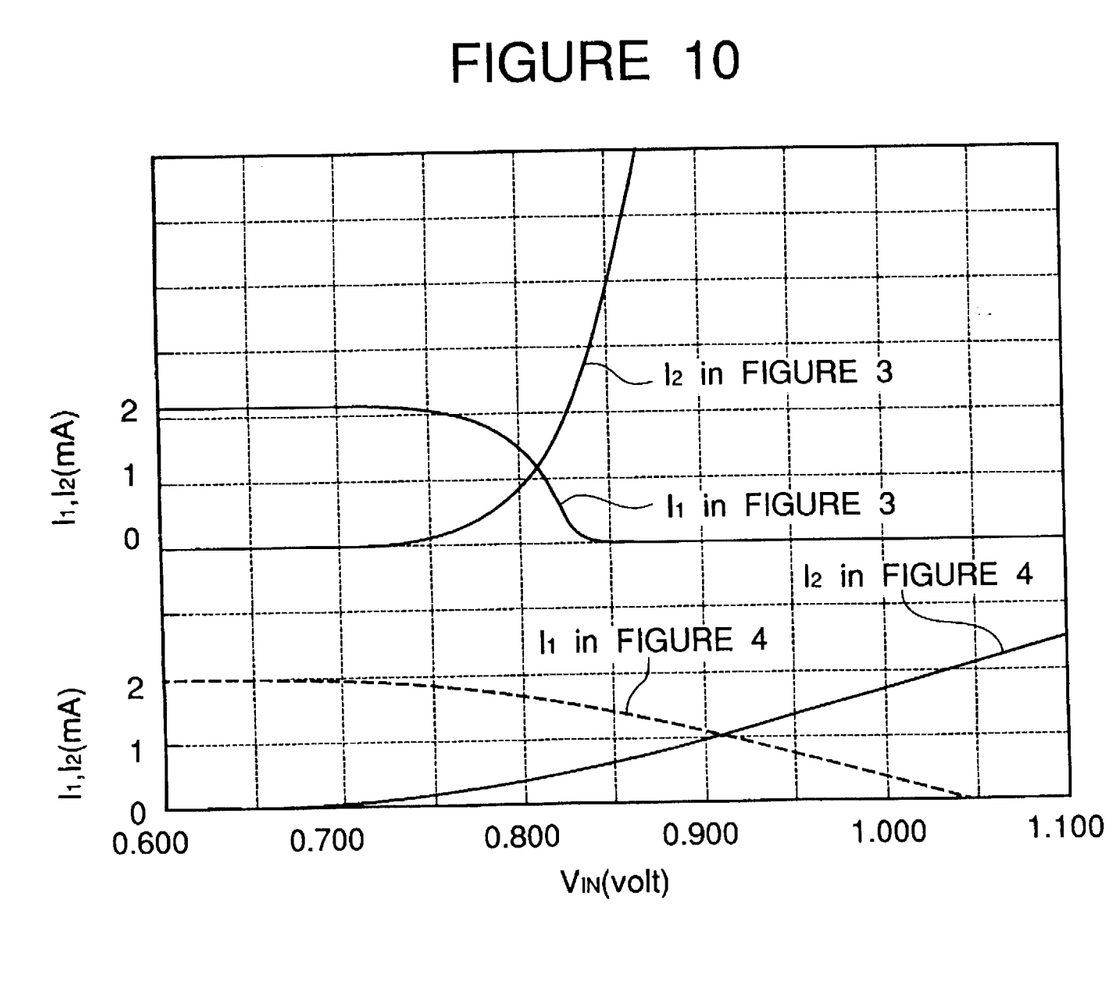
FIG. 10 is a graph illustrating an input-to-output characteristics of the voltage-to-current converting circuits shown in FIGS. 3 and 4.

Accordingly, in a region in which a relation of I1≈I2≈(I0/2) holds, the currents I1 and I2 become complementary to each other having the current of (I1/2) as a center axis. Referring to FIG. 10, there is shown an input-to-output characteristics of the voltage-to-current converting circuit shown in FIG. 3 when the constant current source 21 is formed of a resistor. In FIG. 10, the axis of abscissas indicates the input voltage Vin, and the axis of ordinates shows the output currents I1 and I2. It could be seen from FIG. 10 that the output currents I1 and I2 are complementary to each other in the proximity of about Vin=0.81 V. Namely, it would be understood that the circuit shown in FIG. 3 constitutes a voltage-to-current converting circuit receiving the voltage Vin as an input and outputting the currents I1 and I2.

Figure 4:
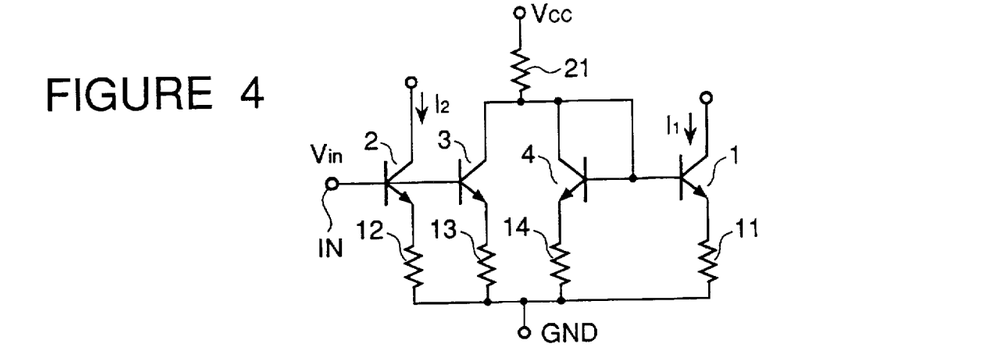
FIG. 4 is a circuit diagram of a second embodiment of the voltage-to-current converting circuit in accordance with the present invention.

Referring to FIG. 4, there is shown a circuit diagram of a second embodiment of the voltage-to-current converting circuit in accordance with the present invention. In FIG. 4, elements similar or corresponding to those shown in FIG. 3 are given the same Reference Numerals, and explanation thereof will be omitted for simplification of description.

The second embodiment shown in FIG. 4 is different from the first embodiment shown in FIG. 3 in that resistors 11, 12, 13 and 14 are inserted between the ground and the emitter of the transistors 1, 2, 3 and 4, respectively, and the constant current source 21 is formed of a resistor connected between the supply voltage $V_{CC}$ and the collector of the transistors 3 and 4.

An input-to-output characteristics of the voltage-to-current converting circuit shown in FIG. 4 is also shown in FIG. 10. It could be seen from FIG. 10 that the insertion of the emitter resistors 11, 12, 13 and 14 has improved the linearity of the input-to-output characteristics, in comparison with the first embodiment shown in FIG. 3. The output currents I1 and I2 are complementary to each other in a large extent having a center of Vin=0.91 V and changing in the range of ±0.1 V. Namely, an excellent voltage-to-current converting characteristics can be realized.

Incidentally, each of the first and second embodiments is configured to response to a single-phase voltage input Vin so as to generate a pair of complementary current outputs I1 and I2.

Figure 5:
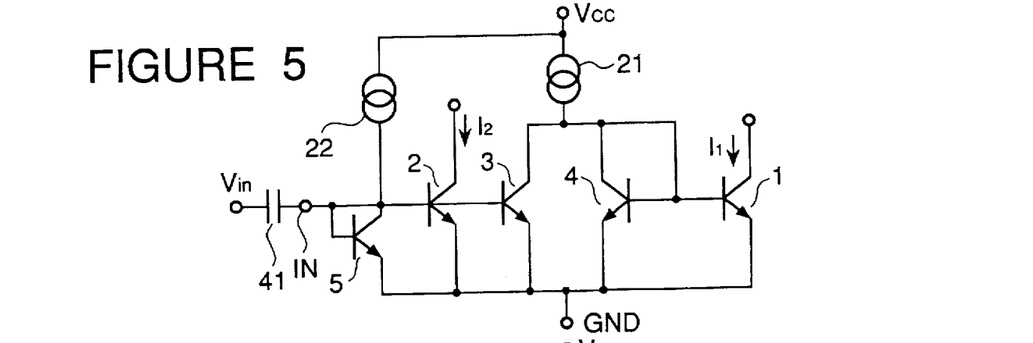
FIG. 5 is a circuit diagram of a third embodiment of the voltage-to-current converting circuit in accordance with the present invention.

Referring to FIG. 5, there is shown a circuit diagram of a third embodiment of the voltage-to-current converting circuit in accordance with the present invention. In FIG. 5, elements similar or corresponding to those shown in FIG. 3 are given the same Reference Numerals, and explanation thereof will be omitted for simplification of description.

The third embodiment shown in FIG. 5 is different from the first embodiment shown in FIG. 3 in that a base biasing circuit for the transistor 2 is added. The base biasing circuit includes an emitter-grounded NPN transistor 5 connected in the form of a diode to have a base and a collector connected in common to the base of the transistor 2, and a constant current source 22 connected between the supply voltage $V_{CC}$ and the collector of the additional transistor 5 so as to define a collector current of the transistor 5.

Here, assuming that each of the constant current sources 21 and 22 is formed of a resistor, and a resistance of these resistors 21 and 22 are $R_{21}$ and $R_{22}$, respectively, if the relation of $$R_{22} = (R_{21}/2) \qquad (2)$$

is fulfilled, it is possible to realize a bias of I1=I2.

Namely, the transistors 2 and the transistor 5 constitutes a current mirror, a relation of $I2=(V_{CC-VBE})/R_{22}$ holds, where $V_{BE}$ is a base-emitter voltage drop of an NPN transistor. On the other hand, the current flowing through the resistor 21 can be expressed as $(V_{CC}-V_{BE})/R_{21}$. Since the transistors 3 and the transistor 5 constitutes a current mirror, the current flowing through the transistor 4 can be expressed as follows:

$$\{(V_{CC}-V_{BE})/R_{21}\} - \{(V_{CC}-V_{BE})/R_{22}\} \qquad (3)$$

This current becomes equal to the current I1 flowing through the transistor 1. By the equation (2) in introduced into the equation (3), $$I1 = \{2(V_{CC}-V_{BE})/R_{22}\} - \{(V_{CC}-V_{BE})/R_{22}\}$$

Therefore, $$I1 = (V_{CC}-V_{BE})/R_{22} = I2 \qquad (4)$$

Namely, I1=I2 can be obtained.

Therefore, by applying the input signal Vin through a capacitor 41 to the input terminal IN, a pair of complementary current I1 and I2 can be obtained from the circuit shown in FIG. 5.

Figure 6:
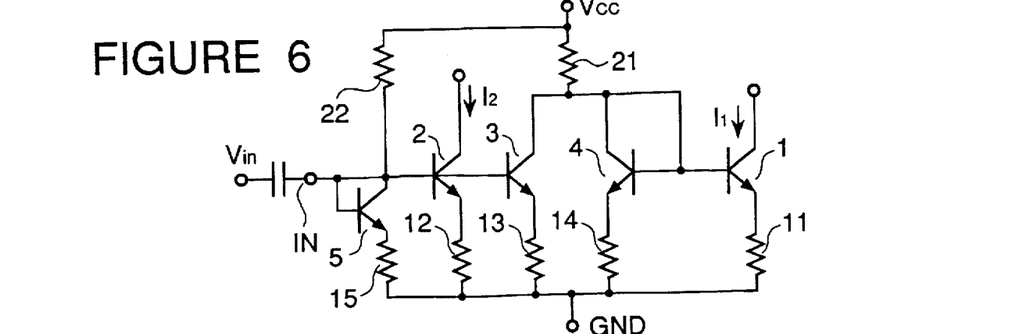
FIG. 6 is a circuit diagram of a fourth embodiment of the voltage-to-current converting circuit in accordance with the present invention.

Referring to FIG. 6, there is a circuit diagram of a fourth embodiment of the voltage-to-current converting circuit in accordance with the present invention. In FIG. 6, elements similar or corresponding to those shown in FIG. 5 are given the same Reference Numerals, and explanation thereof will be omitted for simplification of description.

The fourth embodiment shown in FIG. 6 is different from the third embodiment shown in FIG. 5 in that resistors 11, 12, 13, 14 and 15 are inserted between the ground and the emitter of the transistors 1, 2, 3, 4 and 5, respectively, in order to improve the linearity of the input-to-output characteristics, similarly to the second embodiment. In addition, each of the constant current sources 21 and 22 is formed of a resistor connected between the supply voltage $V_{CC}$ and the collector of the corresponding transistor.

Figure 7:
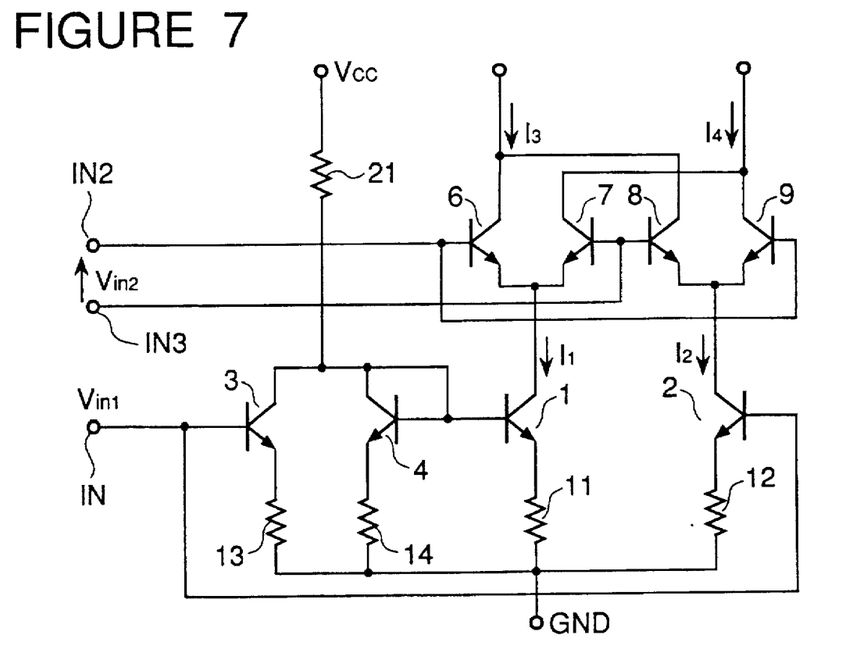
FIG. 7 is a circuit diagram of a first embodiment of the analog multiplying circuit in accordance with the present invention, including the voltage-to-current converting circuit in accordance with the present invention.

Referring to FIG. 7, there is shown a circuit diagram of a first embodiment of the analog multiplying circuit in accordance with the present invention, including the voltage-to-current converting circuit shown in FIG. 4. In FIG. 7, therefore, elements similar or corresponding to those shown in FIG. 4 are given the same Reference Numerals, and explanation thereof will be omitted for simplification of description.

The analog multiplying circuit shown in FIG. 7 is so constructed that the currents I1 and I2 obtained by the voltage-to-current converting circuit shown in FIG. 4 in response to the input voltage signal Vin, are applied to transistors 1 and 2 of the Gilbert cell composed of transistors 1, 2, 6, 7, 8 and 9. This circuit construction is equivalent to the Gilbert cell shown in the conventional circuit excepting that the constant current circuits are omitted.

In brief, the shown Gilbert cell includes a first differential composed of a pair of transistor 6 and 7 having their emitters connected in common to the collector of the transistor 1 and their base connected to second and third input terminals IN2 and IN3, respectively, and also a second differential pair connected to the transistor 2 and composed of a pair of transistor 8 and 9 having their emitters connected in common to the collector of the transistor 2 and their base connected to third and second input terminals IN3 and IN2, respectively. A collector of the transistor 6 and a collector of the transistor 8 are connected to each other to allow a combined collector current I3, and a collector of the transistor 7 and a collector of the transistor 9 are connected to each other to allow a combined collector current I4.

With this arrangement, a first voltage input Vin1 is applied to the first input terminal IN, and a second voltage input Vin2 is applied between the second and third input terminals IN2 and IN3, in the form of a differential form, so that the result of the multiplication of Vin1 and Vin2 can be obtained as the output currents I3 and I4.

Figure 11:
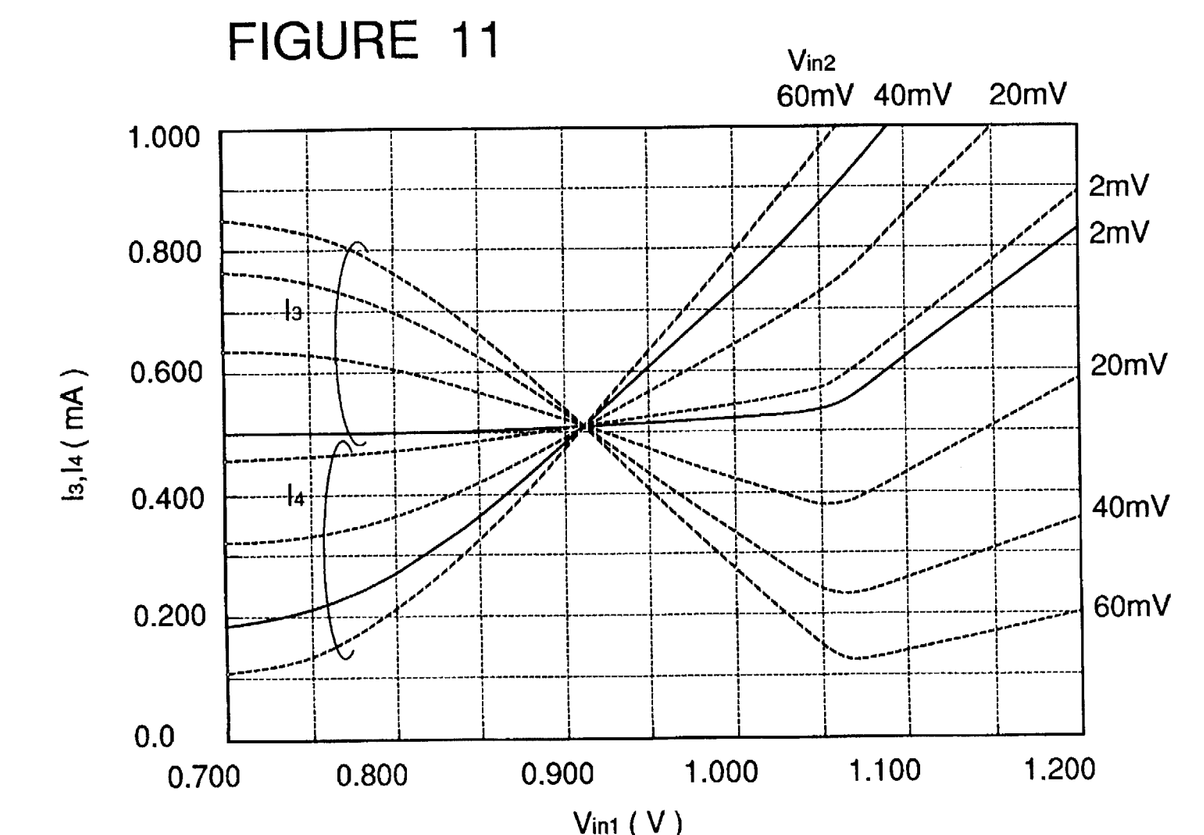
FIG. 11 is a graph illustrating one example of an input-to-output characteristics of the analog multiplying circuit shown in FIG. 7.

Referring to FIG. 11, there is shown a graph illustrating one example of an input-to-output characteristics of the voltage-to-current converting circuit shown in FIG. 7. In FIG. 11, the characteristics of the output currents I3 and I4 to the first input voltage Vin1 is shown using the second input voltage Vin2 as a parameter. In the range of Vin1=0.91 V±0.1 V, complementary output currents I3 and I4 can be obtained, and the result of the multiplication of the first input voltage Vin1 and the second input voltage Vin2 can be obtained.

Figure 12:
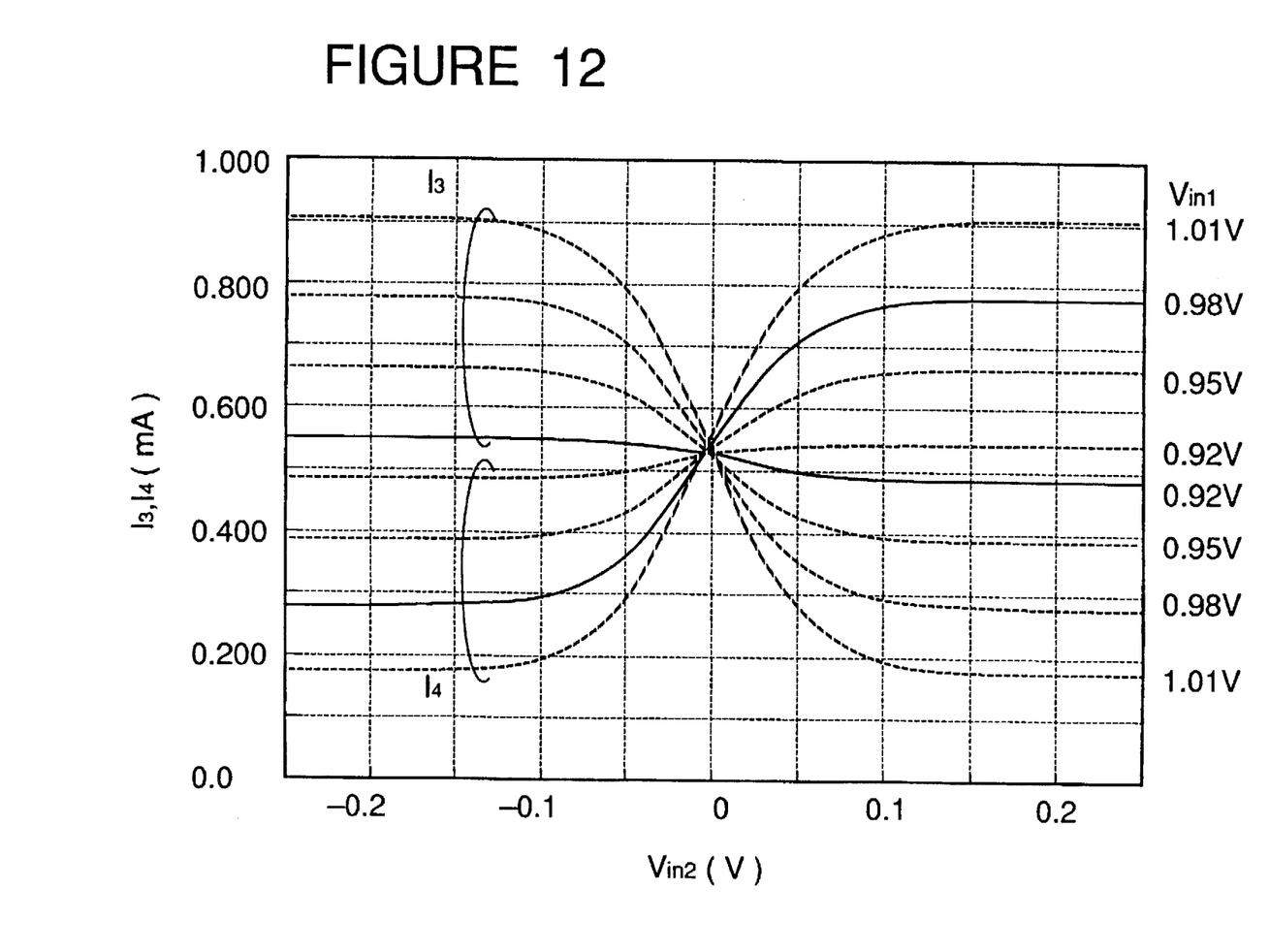
FIG. 12 is a graph illustrating another example of an input-to-output characteristics of the analog multiplying circuit shown in FIG. 7.

Referring to FIG. 12, there is shown a graph illustrating the input-to-output characteristics of the output currents I3 and I4 to the second input voltage Vin2 using the first input voltage Vin1 as a parameter. In the range of Vin1=0 V±50 mV, complementary output currents I3 and I4 can be obtained, and the result of the multiplication of the first input voltage Vin1 and the second input voltage Vin2 can be obtained.

Figure 8:
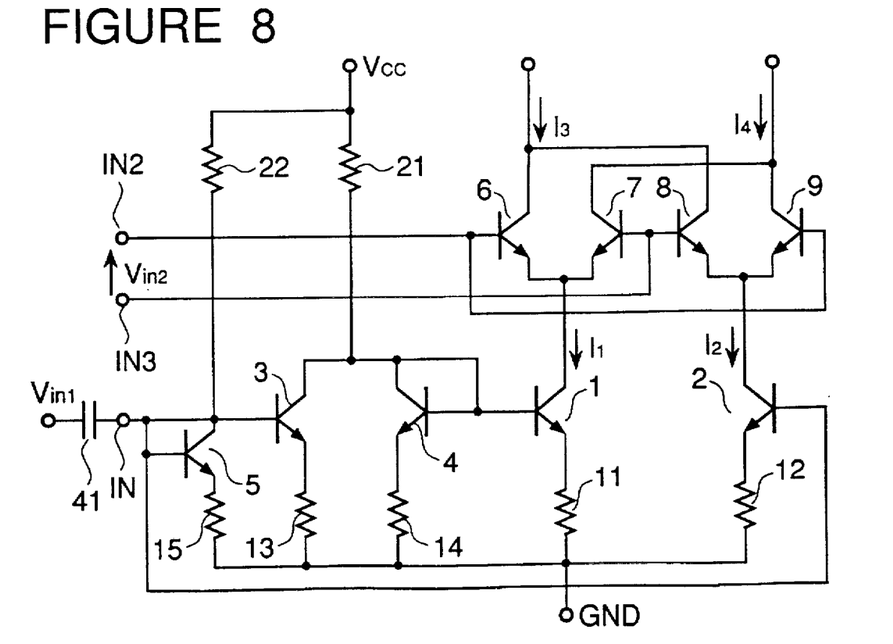
FIG. 8 is a circuit diagram of a second embodiment of the analog multiplying circuit in accordance with the present invention, including the voltage-to-current converting circuit in accordance with the present invention.

Referring to FIG. 8, there is shown a circuit diagram of a second embodiment of the analog multiplying circuit in accordance with the present invention, including the voltage-to-current converting circuit shown in FIG. 6. In other words, the analog multiplying circuit shown in FIG. 8 is a modification of the analog multiplying circuit shown in FIG. 7. In FIG. 8, therefore, elements similar or corresponding to those shown in FIGS. 6 and 7 are given the same Reference Numerals, and explanation thereof will be omitted for simplification of description.

In the analog multiplying circuit shown in FIG. 8, the bias circuit composed of the transistor 5 connected in the form of a diode and the resistors 15 and 22 are added to the circuit shown in FIG. 7. In addition, the first input voltage Vin1 is added through a capacitor 41 to the first input terminal IN. The output currents I3 and I4 are obtained as the result of the result of the multiplication of the first input voltage Vin1 and the second input voltage Vin2.

Figure 9:
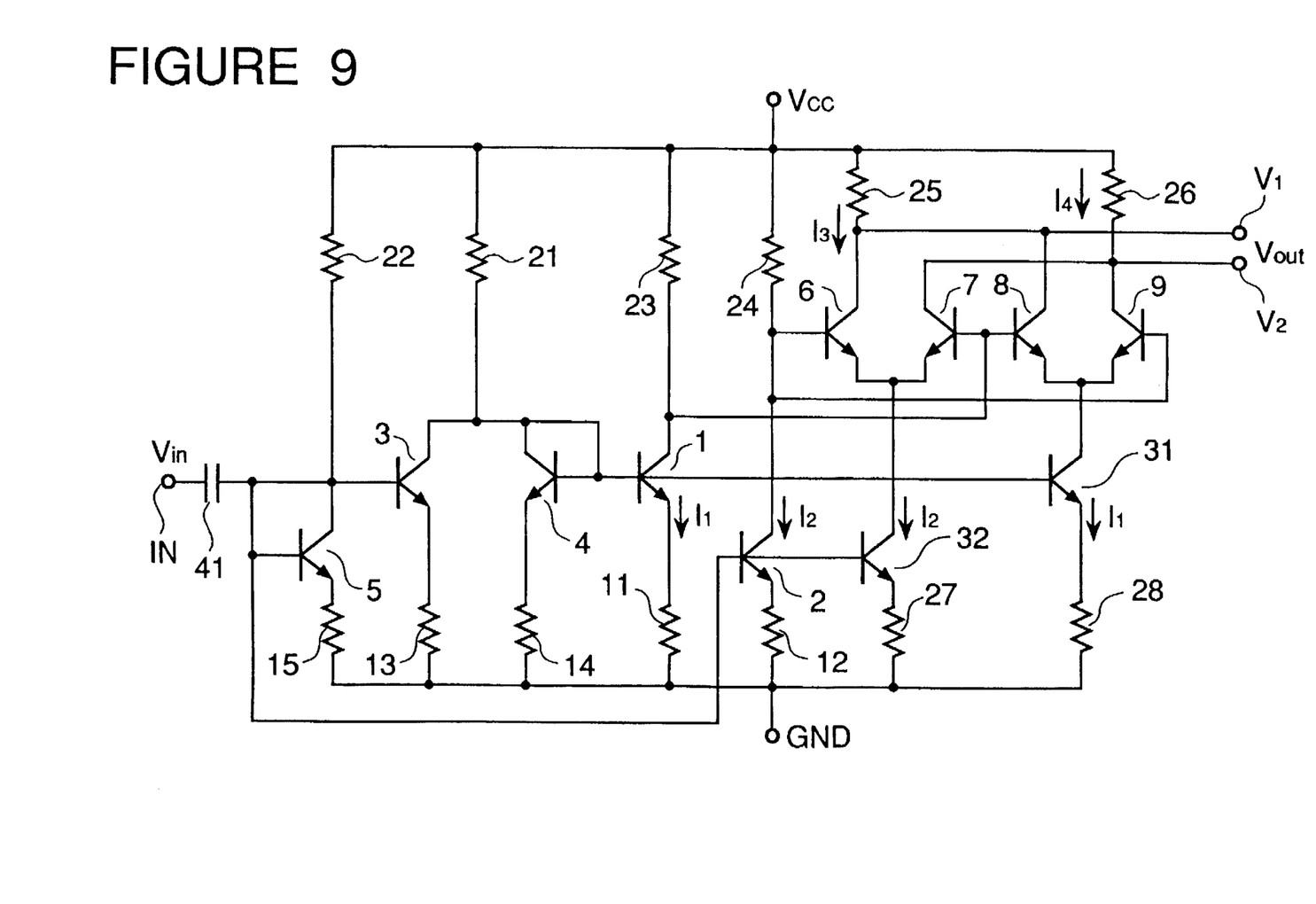
FIG. 9 is a circuit diagram of an embodiment of the frequency doubler circuit in accordance with the present invention, including the voltage-to-current converting circuit in accordance with the present invention.

Referring to FIG. 9, there is shown a circuit diagram of an embodiment of the frequency doubler circuit in accordance with the present invention, including the analog multiplying circuit shown in FIG. 8. In FIG. 9, therefore, elements similar or corresponding to those shown in FIG. 8 are given the same Reference Numerals, and explanation thereof will be omitted for simplification of description.

An input signal Vin is applied through a capacitor 41 to the voltage-to-current converting circuit so that a pair of complementary currents I1 and I2 are obtained. Resistors 23 and 24 are connected between the supply voltage $V_{CC}$ and the collector of the transistors 1 and 2, respectively, so that a difference between the pair of complementary currents I1 and I2 are converted into a voltage signal, which is applied between respective bases of the transistors 6 and 7 of the first differential pair, and between respective bases of the transistors 8 and 9 of the second differential pair, respectively. In addition, a transistor 31 having a base connected to the base of the transistor 1 is connected between the ground and the common-connected emitters of the transistors 8 and 9 of the second differential pair, and a transistor 32 having a base connected to the base of the transistor 2 is connected between the ground and the common-connected emitters of the transistors 6 and 7 of the first differential pair. Thus, the difference between the pair of complementary currents I1 and I2 converted into the voltage signal, is multiplied with a difference between the currents I1 and I2 flowing through the transistors 31 and 32, so that output currents I3 and I4 indicative of a square of Vin can be obtained. Accordingly, an output voltage Vout including a frequency component which is a double of that of the input signal Vin can be obtained.

Figure 13:
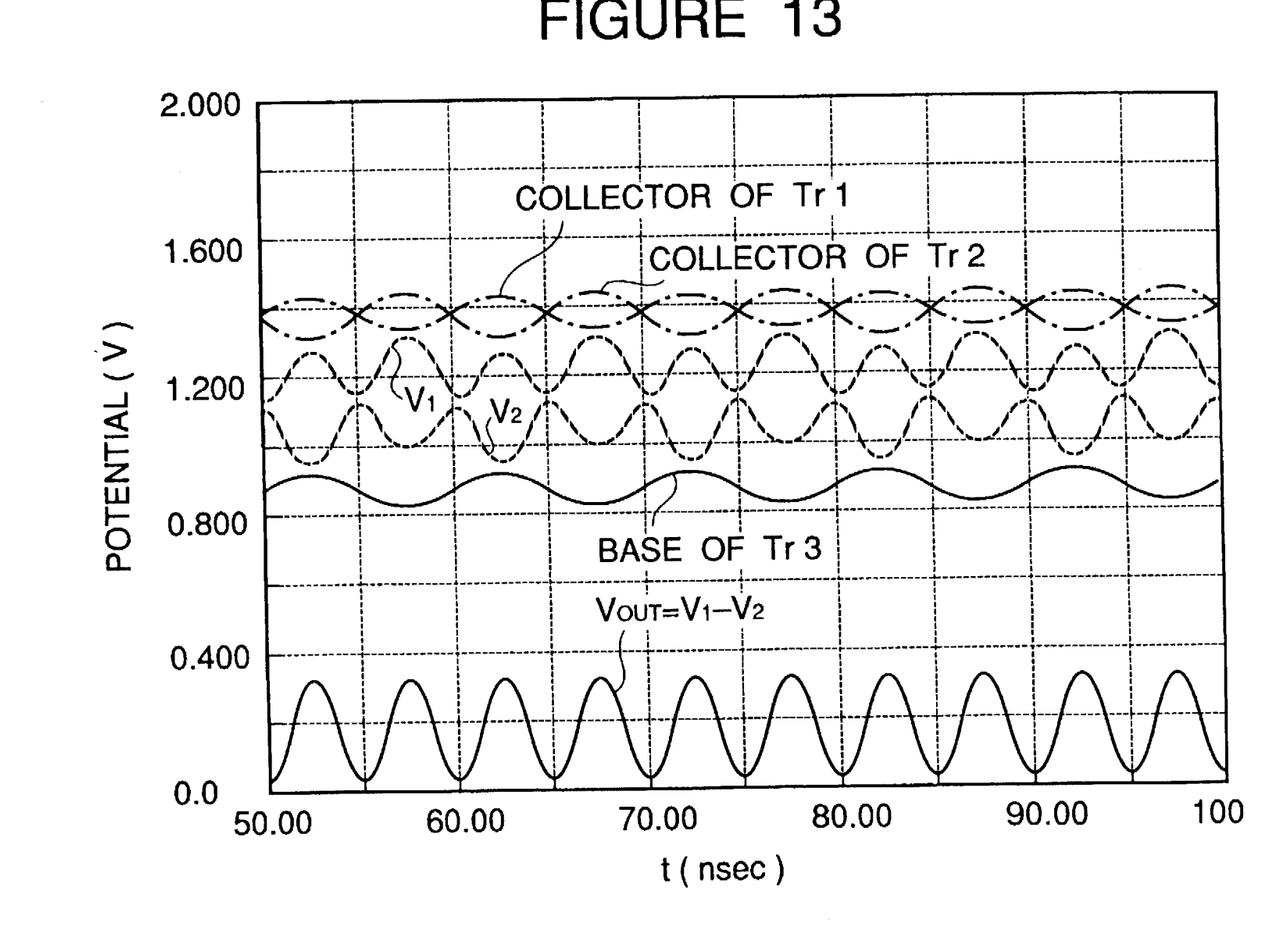
FIG. 13 is a graph illustrating one example of an operation characteristics of the frequency doubler circuit shown in FIG. 9.

FIG. 13 is a graph illustrating the waveforms at various points in the circuit shown in FIG. 9 including the output voltage Vout, in the case that $V_{CC}$=1.5 V, and the input signal Vin is 100 MHz and 40 mVpp (where Vpp means a peak-to-peak voltage).

In the circuit shown in FIG. 9, the input voltage Vin is applied through the capacitor 41, so that the collector voltages of the transistors 1 and 2 constitute a pair of complementary voltages, which are in turn multiplied with the currents I1 and I2. As a result, voltages V1 and V2 are obtained. Here, considering Vout=V1−V2, it would be seen that an output having a frequency (200 MHz) which is a double of the input signal frequency (100 MHz) is obtained. Namely, the frequency doubling is realized.

Figure 14:
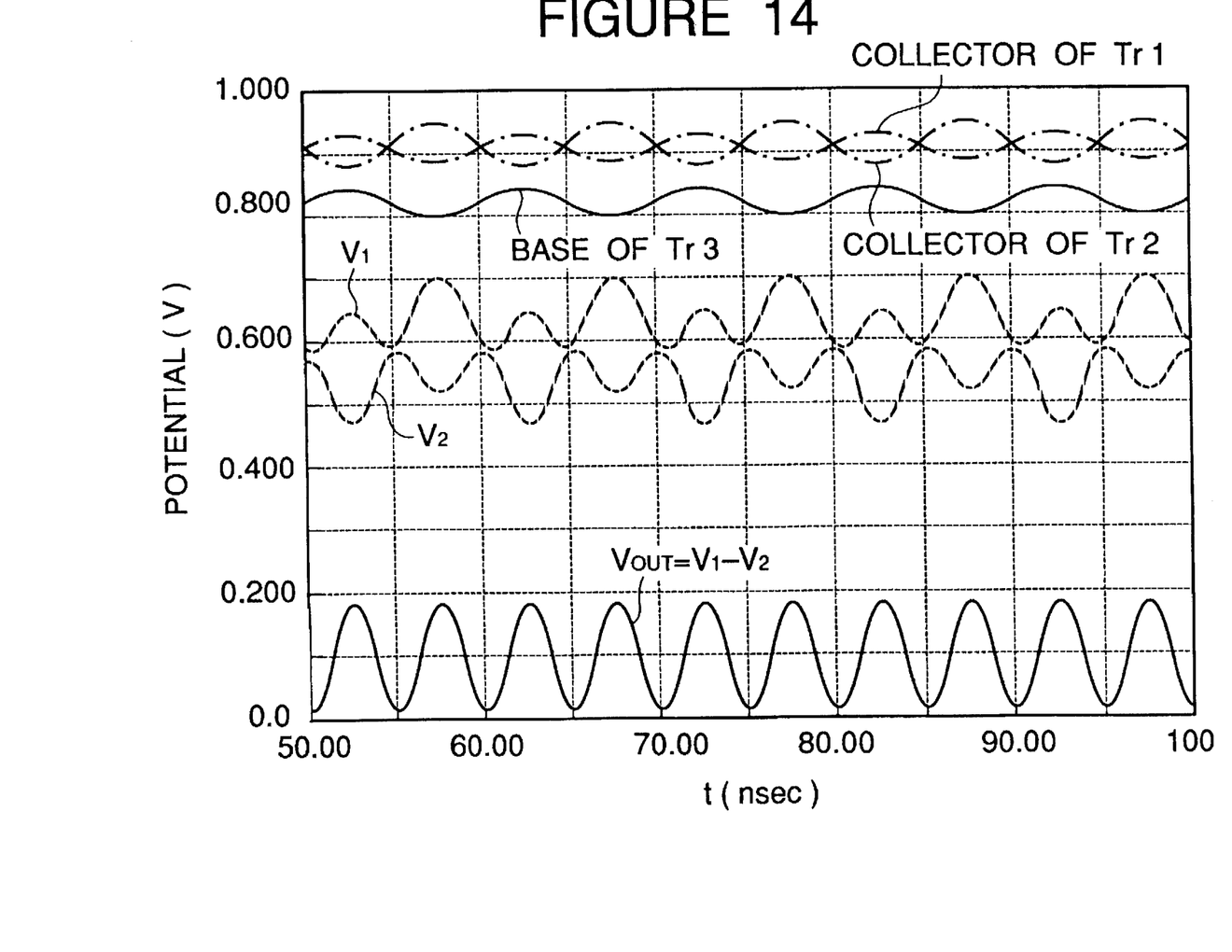
FIG. 14 is a graph illustrating another example of an operation characteristics of the frequency doubler circuit shown in FIG. 9.

Referring to FIG. 14, there is shown a graph illustrating the waveforms at various points in the circuit shown in FIG. 9 including the output voltage Vout, in the case that $V_{CC}$=1 V, and the input signal Vin is 100 MHz and 40 mVpp (where Vpp means a peak-to-peak voltage). It could be confirmed from FIG. 14 that the circuit shown in FIG. 9 can operated with the supply voltage of 1 V.

The frequency doubler circuit shown in FIG. 9 utilizing the voltage-to-current converting circuit in accordance with the present invention has been explained with reference to FIGS. 13 and 14. However, since the circuit shown in FIG. 8 is the multiplying circuit, it would be understood to persons skilled in the art that the voltage-to-current converting circuit in accordance with the present invention can be applied to not only the analog multiplying circuit and the frequency doubler but also a frequency mixer, a multiplexer, a flipflop, etc.

In the above mentioned voltage-to-current converting circuit in accordance with the present invention, the transistor connected in the diode form connected in series with the constant current circuit composed of for example the resistor 21 is connected in parallel to the transistor 3 having the base receiving the input voltage Vin, so that a difference between the current flowing through the resistor 21 and the current flowing through the transistor 3 will flow through the transistor 4. The current I2 is obtained from the collector of the transistor 2 which cooperates with the transistor 3 so as to form a current mirror, and on the other hand, the current I1 is obtained from the collector of the transistor 1 which cooperates with the transistor 4 so as to form a current mirror. Thus, the input voltage Vin is converted into the output currents I1 and I2.

With the above mentioned arrangement, since the voltage-to-current converting circuit can be constituted of only NPN transistors, the manufacturing process for PNP transistors are no longer required, so that the steps of the manufacturing process can be reduced. Therefore, the LSI can be inexpensively manufactured. In addition, since the emitter follower is not required, the circuit can operate with a low supply voltage of 1.5 V (1 V under the special condition).

The invention has thus been shown and described with reference to the specific embodiments. However, it should be noted that the present invention is in no way limited to the details of the illustrated structures but changes and modifications may be made within the scope of the appended claims.

I claim:

1. A voltage-to-current converting circuit comprising:

a constant current source having one end connected to a voltage supply;

a first transistor having a base connected to a first input terminal and an emitter connected to ground, so that an output current is obtained from a collector of said first transistor;

a second transistor having a base connected to said first input terminal and an emitter connected to ground, a collector of said second transistor being connected to the other end of said constant current source;

a third transistor having an emitter connected to ground, and a base and a collector connected in common to the other end of said constant current source;

a fourth transistor having a base connected to said base and said collector of said third transistor, and an emitter connected to ground, so that an output current is obtained from a collector of said fourth transistor;

whereby a voltage applied to said first input terminal is converted into the output currents of said fourth and first transistors.

2. A voltage-to-current converting circuit claimed in claim 1 wherein said emitter of each of said first to fourth transistors is connected through a resistor to the ground.

3. A voltage-to-current converting circuit claimed in claim 2 wherein said constant current source is constituted of a resistor connected at its one end to said voltage supply and at its other end to said collector of said second and third transistors.

4. A voltage-to-current converting circuit claimed in claim 3 further including a fifth transistor having a base and a collector connected in common to said first input terminal and an emitter connected to the ground, a second constant current source connected between said first input terminal and said voltage supply, and a capacitor having one end connected to said first input terminal, an input signal being applied to the other end of said capacitor from an external.

5. A voltage-to-current converting circuit claimed in claim 4 wherein said second constant current source is constituted of a resistor connected at its one end to said voltage supply and at its other end to said first input terminal.

6. A voltage-to-current converting circuit claimed in claim 5 further including:

sixth and seventh transistors having their emitter connected in common to said collector of said fourth transistor; and eighth and ninth transistors having their emitter connected in common to said collector of said first transistor, a base of each of said sixth and ninth transistors being connected to a second input terminal, and a base of each of said seventh and eighth transistors being connected to a third input terminal, a first input signal being applied to said first input terminal, and a second input signal being applied between said second and third input terminals in the form of a differential signal, a collector of said sixth transistor and a collector of said eighth transistor being connected to each other so that a third output current is obtained, and a collector of said seventh transistor and a collector of said ninth transistor being connected to each other so that a fourth output current is obtained.

7. A voltage-to-current converting circuit claimed in claim 3 further including:

sixth and seventh transistors having their emitter connected in common to said collector of said fourth transistor; and eighth and ninth transistors having their emitter connected in common to said collector of said first transistor, a base of each of said sixth and ninth transistors being connected to a second input terminal, and a base of each of said seventh and eighth transistors being connected to a third input terminal, a first input signal being applied to said first input terminal, and a second input signal being applied between said second and third input terminals in the form of a differential signal, a collector of said sixth transistor and a collector of said eighth transistor being connected to each other so that a third output current is obtained, and a collector of said seventh transistor and a collector of said ninth transistor being connected to each other so that a fourth output current is obtained.

* * * * *